United States Patent
Berman et al.

(10) Patent No.: US 11,205,498 B1
(45) Date of Patent: Dec. 21, 2021

(54) ERROR DETECTION AND CORRECTION USING MACHINE LEARNING

(71) Applicant: SAMSUNG ELECTRONICS CO., LTD., Suwon-si (KR)

(72) Inventors: Amit Berman, Binyamina (IL); Evgeny Blaichman, Tel Aviv (IL); Ron Golan, Shoham (IL); Sergey Gendel, Haifa (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/923,334

(22) Filed: Jul. 8, 2020

(51) Int. Cl.
| G11C 29/42 | (2006.01) |
| G11C 29/44 | (2006.01) |
| G11C 29/12 | (2006.01) |
| H03M 13/39 | (2006.01) |
| G06N 20/00 | (2019.01) |
| G11C 7/06  | (2006.01) |

(52) U.S. Cl.
CPC ............. *G11C 29/42* (2013.01); *G06N 20/00* (2019.01); *G11C 7/06* (2013.01); *G11C 29/12005* (2013.01); *G11C 29/44* (2013.01); *H03M 13/3927* (2013.01); *G11C 2029/1202* (2013.01); *G11C 2029/1204* (2013.01)

(58) Field of Classification Search
CPC ..... G11C 29/42; G11C 7/06; G11C 29/12005; G11C 29/44; G11C 2029/1204; G11C 2029/1202; G06N 20/00; H03M 13/3927
See application file for complete search history.

(56) References Cited

U.S. PATENT DOCUMENTS

2012/0084622 A1\* 4/2012 D'Abreu ............ G06F 11/1048
714/755
2012/0317463 A1\* 12/2012 Sugahara ............ H03M 13/05
714/785

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).\*

Mustafa M. Shihab et al., "Addressing Fast-Detrapping for Reliable 3D NAND Flash Design", ACM TACO, 15-2, 17, 2018, https://mustafashihab.com/revenand.pdf.

Yu Cai et al., "Program Interference in MLC NANO Flash Memory: Characterization, Modeling, and Mitigation", 2013 IEEE.

(Continued)

*Primary Examiner* — Ajay Ojha
(74) *Attorney, Agent, or Firm* — F. Chau & Associates, LLC

(57) ABSTRACT

A memory system including a memory device and a memory controller including a processor. The memory controller is configured to read outputs from the memory cells in response to a read command from a host and to convert the read outputs to a first codeword. The processor performs a first error correcting code (ECC) operation on the first codeword. The processor is further configured to apply, for each selected memory cell among the memory cells, a corresponding one of the read outputs and at least one related feature as input features to a machine learning algorithm to generate a second codeword, and the memory controller is configured to perform a second ECC operation on the second codeword, when the first ECC operation fails.

20 Claims, 11 Drawing Sheets

(56) References Cited

OTHER PUBLICATIONS

Guiqiang Dong et al., "Using Data Postcompensation and Predistortion to Tolerate Cell-to-Cell Interference in MLC NAND Flash Memory", IEEE Transactions On Circuits and Systems—I: Regular Papers, vol. 57, No. 10, Oct. 2010.

Mustafa M. Shihab et al.,"ReveNAND: A Fast-Drift-Aware Resilient 3D NAND Flash Design", ACM Trans. Archit. Code Optim. 15, 2, Article 17 (Apr. 2018).

Yixin Luo et al., "Improving 3D NAND Memory Lifetime by Tolerating Early Retention Loss and Process Variation", Proc. ACM Meas. Anal. Comput. Syst. (2018).

Yu Cai et al., "Experimental Characterization, Optimization, and Recovery of Data Retention Errors in MLC NAND Flash Memory", arXiv:1805.02819v1 [cs.AR] May 8, 2018.

* cited by examiner

FIG. 10

LLR lookup table

| page 3 HD bit | uncertainty bits | LLR |
|---|---|---|
| 1 | 00 | -6.7 |
| 1 | 01 | -4.8 |
| 1 | 10 | -2.3 |
| 1 | 11 | -0.5 |
| 0 | 11 | +0.5 |
| 0 | 10 | +2.3 |
| 0 | 01 | +4.8 |
| 0 | 00 | +6.7 |

FIG. 11

| Feature | value |
|---|---|
| Feature | value |
| Cell Voltage | -20mV |
| Pillar neighbor up voltage | 1280 mV |
| Pillar neighbor down voltage | 2140 mV |
| WL neighbors | 2320, -620, 1280, 940, -80, -1740 mV |
| HD thresholds | 15 thresholds values |
| WL index | 100 |

ERROR DETECTION AND CORRECTION USING MACHINE LEARNING

TECHNICAL FIELD

Exemplary embodiments of the present inventive concept relate to a memory device configured to perform error detection and correction using machine learning, and a method of performing error detection and correction on a memory device using machine learning.

DISCUSSION OF RELATED ART

Modern NAND flash memory devices allow for several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels. NAND flash memories have bit errors that may be corrected by error correction codes (ECC). Sources of the bit errors may include inter-wordline interference, intra-wordline interference, retention noise depending on neighbor memory cells, and different wordlines behaving differently due to process, voltage, or temperature changes.

SUMMARY

According to an exemplary embodiment of the inventive concept a memory system is provided. The memory system includes a memory device and a memory controller. The memory device includes a plurality of memory cells, a plurality of wordlines, and a plurality of bitlines. The memory controller includes a processor. The memory controller is configured to read outputs (e.g., channel output) from the memory cells in response to a read command from a host and generate a first codeword (e.g., codeword may have errors due to noise). The memory controller is further configured to perform a first error correcting code (ECC) operation on the first codeword. The processor applies, for each selected memory cell among the memory cells, a corresponding one of the read outputs and at least one other related feature (e.g., a neighbour voltage of a neighbour memory cell) as input features to a machine learning algorithm to generate a second codeword, and the memory controller performs a second ECC operation on the second codeword, when the first ECC operation fails. The neighbour memory cell is connected to a same one of the wordlines as the selected memory cell.

According to an exemplary embodiment of the inventive concept a computer-implemented method for controlling a memory system is provided. The memory system includes a memory device and a memory controller including a processor. The method includes: the memory controller sensing outputs from the memory cells in response to a read command from a host; and the memory controller performing a first correcting code (ECC) operation on a first codeword determined from the read voltages. When the first ECC operation fails, the method further includes the processor, applying for each selected memory cell among the memory cells, a corresponding one of the sensed outputs and at least one related feature (e.g., a neighbour voltage of a neighbour memory cell) as input features to a machine learning algorithm to generate a second codeword, and the memory controller performing a second ECC operation using the second codeword. The neighbour memory cell is connected to a same one of the wordlines as the selected memory cell.

According to an exemplary embodiment of the inventive concept, a memory system is provided. The memory system includes a memory device and a memory controller. The memory device includes a plurality of memory cells, a plurality of wordlines, and a plurality of bitlines and a memory. The memory controller includes a processor. The memory controller is configured to read outputs from the memory cells in response to a read command from a host, and convert the read outputs into a first codeword. The memory controller is further configured to perform a first error correcting code (ECC) operation on the first codeword. The processor is configured to apply, for each selected memory cell among the memory cells, a corresponding one of the read outputs and at least one related feature (e.g., a pillar voltage of a neighbour memory cell) as input features to a machine learning algorithm to generate a second codeword, and the memory controller is configured to perform a second ECC operation using the second codeword, when the first ECC operation fails. The neighbour memory cell is connected to a same one of the bitlines as the selected memory cell.

According to an exemplary embodiment of the inventive concept, a computer-implemented method for controlling a memory system is provided. The memory system includes a memory device and a memory controller including a processor. The method includes: the memory controller sensing outputs from the memory cells in response to read command from a host; and the memory controller performing a first correcting code (ECC) operation on a first codeword generated from the read voltages. When the first ECC operation fails, the method further includes: the processor, applying, for each selected memory cell among the memory cells, a corresponding one of the sensed outputs and at least one related feature (e.g., a pillar voltage of a neighbour memory cell) as input features to a machine learning algorithm to generate a second codeword, and the memory controller performing a second ECC operation using the second codeword. The neighbour memory cell is connected to a same one of the bitlines as the selected memory cell.

BRIEF DESCRIPTION OF THE DRAWINGS

The above and other features of the present inventive concept will become more apparent by describing in detail exemplary embodiments thereof with reference to the accompanying drawings, in which:

FIG. 10 is a diagram of an exemplary log likelihood ratio (LLR) table that may be used in embodiments of the inventive concept.

FIG. 11 is a diagram of an exemplary features that may be applied to the neural network according to an exemplary embodiment of the inventive concept.

DETAILED DESCRIPTION

Figure 1:
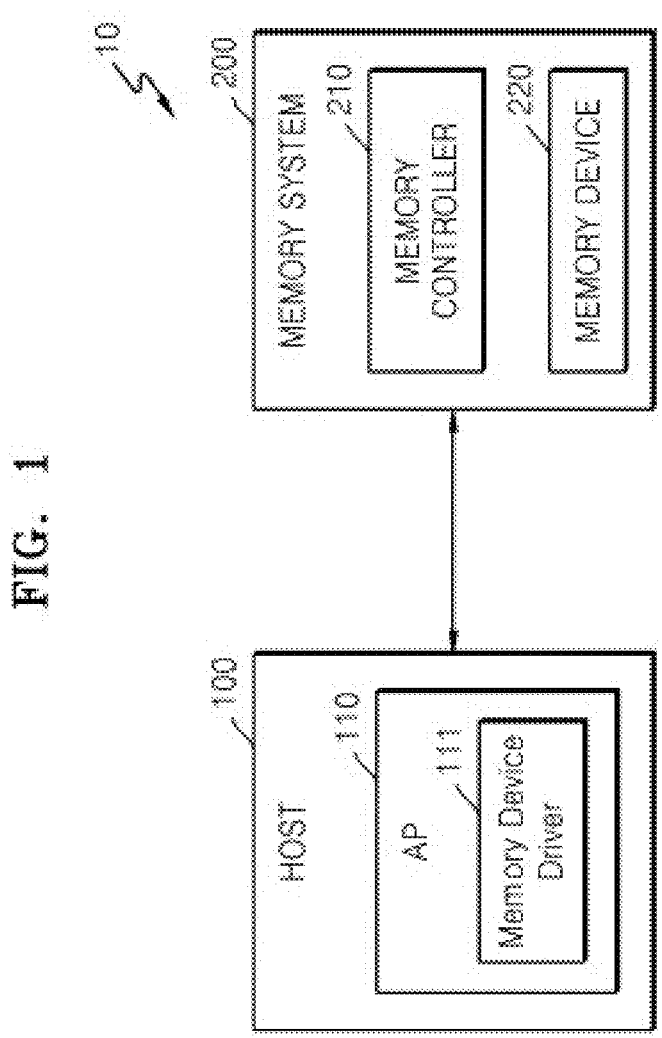
FIG. 1 is a block diagram illustrating an implementation of a data processing system including a memory system, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the non-volatile memory system 200. The host 100 may communicate with the non-volatile memory system 200 to transmit a command (e.g., a read command, a write command, an erase command, etc.) related to a memory operation and receive a confirm command in response to the transmitted command.

The non-volatile memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
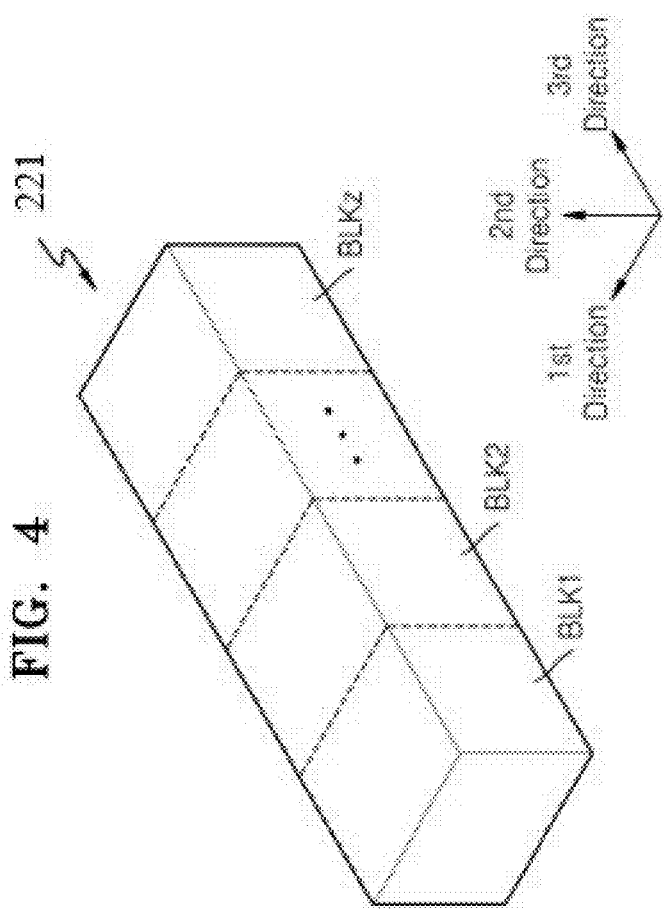
FIG. 4 is a block diagram of the memory cell array of FIG. 2, according to an exemplary embodiment of the inventive concept.

The memory device 220 may include a memory cell array that retains data stored therein, even when the memory device 220 is not powered on. The memory cell array may include as memory cells, for example, a NAND or NOR flash memory, a magnetoresistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
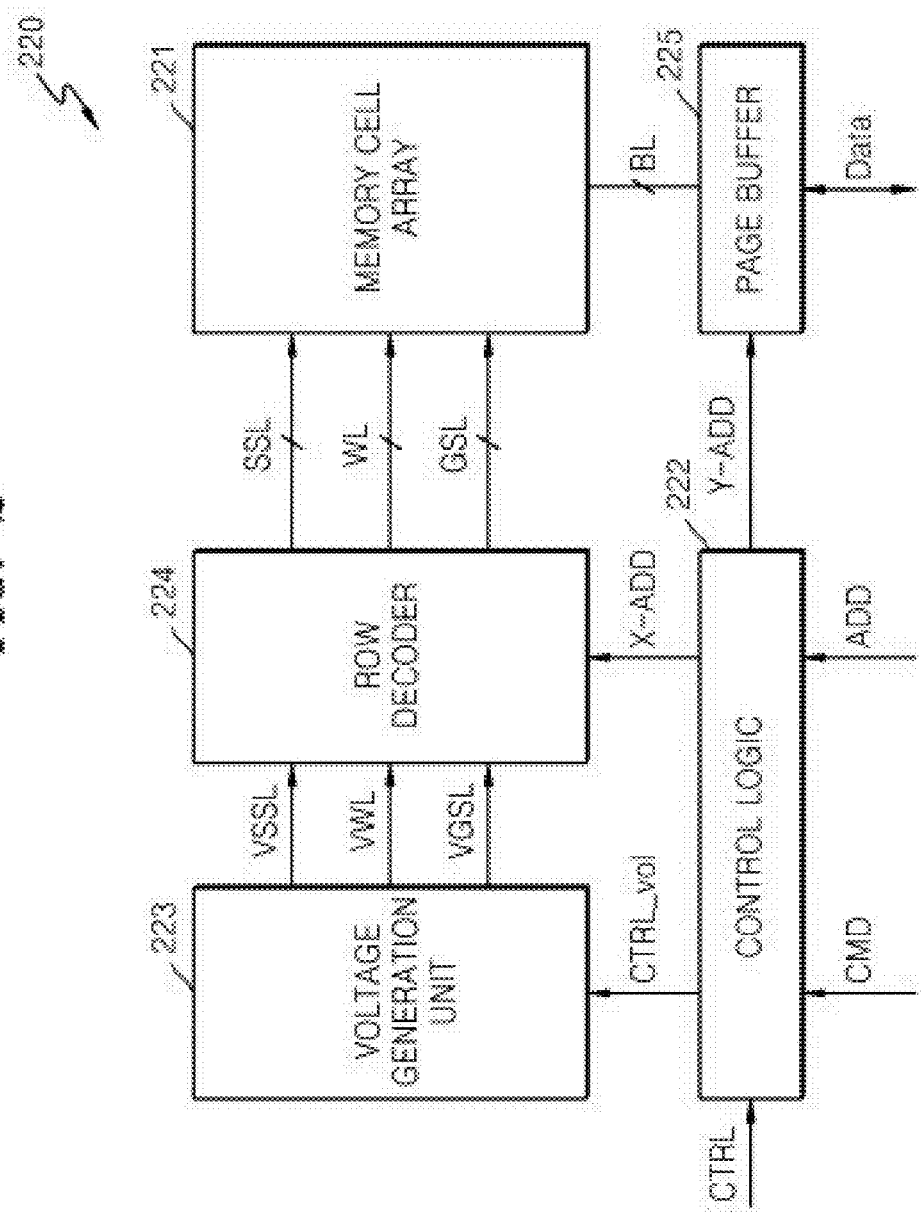
FIG. 2 is a detailed block diagram of a non-volatile memory device of FIG. 1, according to an exemplary embodiment of the inventive concept.

FIG. 2 is a detailed block diagram of the non-volatile memory device 220 of FIG. 1, according to an exemplary embodiment of the inventive concept.

Referring to FIG. 2, the non-volatile memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the non-volatile memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 3:
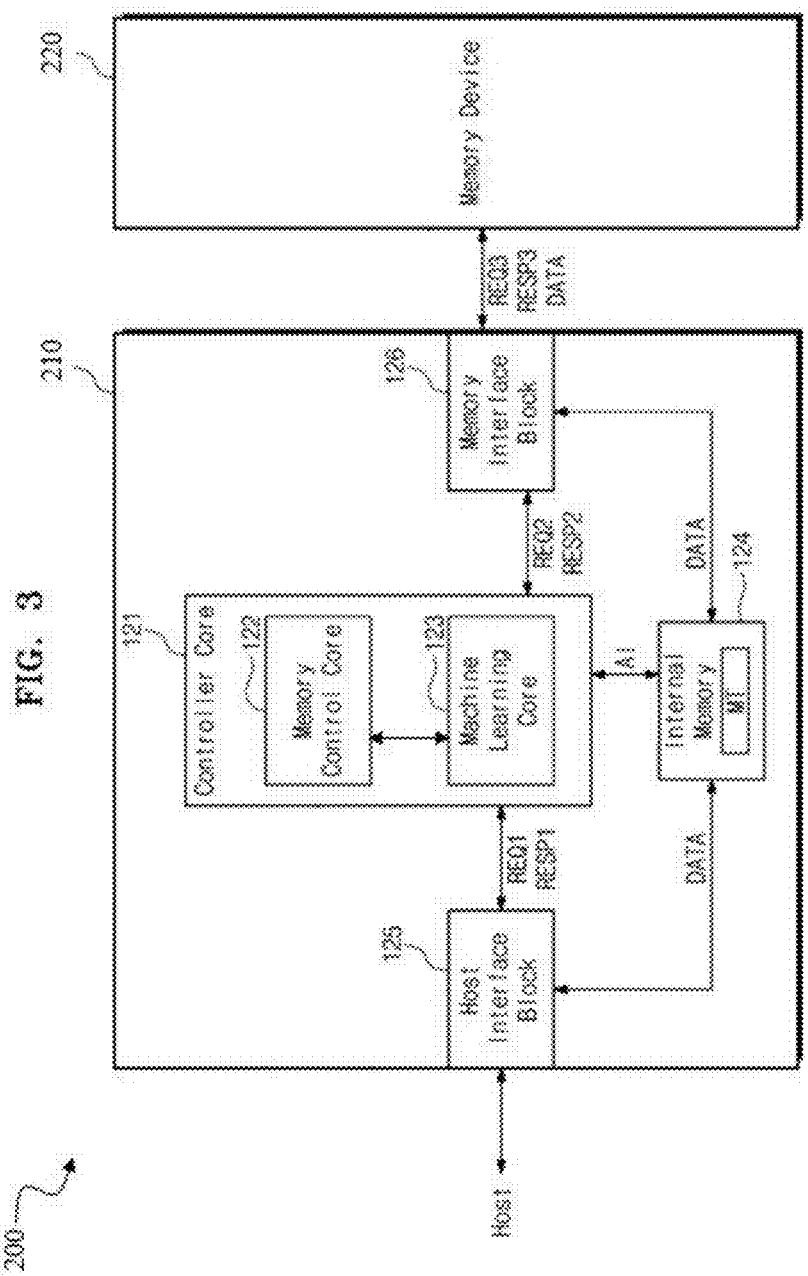
FIG. 3 is a block diagram illustrating the memory system of FIG. 1, according to an exemplary embodiment of the inventive concept.

FIG. 3 is a block diagram illustrating the memory system 200 of FIG. 1, according to an exemplary embodiment of the inventive concept.

Referring to FIG. 3, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 121, an internal memory 124, a host interface block 125, and a memory interface block 126.

The controller core 121 may include a memory control core 122 and a machine learning core 123, and each of these cores may be implemented by one or more processors. The memory control core 122 may control and access the memory device 220 depending on a request received from the host 100 or an internally designated schedule. The memory control core 122 may manage and execute various metadata and codes used to manage or operate the memory system 200. In an exemplary embodiment of the inventive concept, the memory control core 122 includes an error correction code (ECC) circuit to perform error detection and correction on data read from memory cells of the memory device 220. For example, the memory control core 122 may sense read voltages from a subset of the memory cells in response to a read command and address information received a Host, convert the read voltages into a codeword (including data and redundancy information), and perform an ECC operation on the codeword (i.e., first codeword) using the ECC circuit. The memory control core 122 may alternately perform the error detection and correction (i.e., the ECC operation) using an ECC algorithm. The error correction capability of the ECC circuit or the ECC algorithm may be a certain number of bit errors. When the error correction capability has been exceeded, the memory control core 122 is unable to correct the detected errors. Thus, upon reading data from selected memory cells based on the address information and the read command, the memory control core 122 may need to report that the data has been corrupted and cannot be read or corrected.

However, according to an exemplary embodiment of the inventive concept, the machine learning core 123 operates on features of the selected memory (e.g., a cell voltage) and one or more additional related features (e.g., voltages of neighbouring memory cells) to update an input of the ECC circuit or the ECC algorithm to enable the ECC circuit or ECC algorithm to correct the data. For example, the machine learning core 123 may output an updated codeword (i.e., a second codeword) for the ECC or the ECC algorithm to operate on. The machine learning core 123 may execute a machine learning algorithm that receives the features as inputs to generate the updated codeword. The machine learning algorithm may be implemented in hardware, software, or a combination of hardware and software. While the machine learning algorithm will be discussed below as an artificial neural network (or a neural network) for ease of understanding the inventive concept, embodiments of the inventive concept are not limited thereto. For example, the machine learning algorithm could be implemented by a decision tree. If the ECC circuit or ECC algorithm performed on the updated codeword fails, the controller core 121 can log and/or report that an error has occurred.

The internal memory 124 may be used, for example, as a system memory which is used by the controller core 121, a cache memory which stores data of the memory device 220, or a buffer memory which temporarily stores data between the host 100 and the memory device 220. The internal memory 124 may store a mapping table MT that indicates a relationship between logical addresses from the Host assigned to the memory system 200 and physical addresses of the memory device 220. The internal memory 124 may include, for example, a dynamic random access memory (DRAM) or a static random access memory (SRAM).

In an exemplary embodiment, a neural network, such as the neural network described with reference to FIG. 7 and FIG. 8, may be included in a computer program which is stored in the internal memory 124 of the memory controller 210 or in the memory device 220. The computer program including the neural network may be executed by the machine learning core 123 to update the codeword used by an ECC operation of the memory control core 122. Alternately, the neural network may be implemented in hardware. For example, the machine learning core 123 may include one or more logic circuits representing the neural network. Thus, according to exemplary embodiments, the memory system 200 may error correct data stored in the memory device 220 during a normal read operation of the memory device 220. That is, after manufacture of the memory system 200 is complete, during normal operation of the memory system 200, and particularly, during a normal read operation of the memory system 200 in which data is read from the memory device 220, the data stored in the memory device 220 that is being read may be error corrected using the neural network locally stored and executed in the memory system 200, and the error corrected data may be read out from the memory device 220.

The host interface block 125 may include a component for communicating with the host 100 such as, for example, a physical block. The memory interface block 126 may include a component for communicating with the memory device 220 such as, for example, a physical block.

Below, an operation of the memory system 200 over time will be described. When power is supplied to the memory system 200, the memory system 200 may perform initialization with the host 100.

The host interface block 125 may provide the memory control core 122 with a first request REQ1 received from the host 100. The first request REQ1 may include a command (e.g., a read command or a write command) and a logical address. The memory control core 122 may translate the first request REQ1 to a second request REQ2 suitable for the memory device 220.

For example, the memory control core 122 may translate a format of the command. The memory control core 122 may obtain address information AI with reference to the mapping table MT stored in the internal memory 124. The memory control core 122 may translate a logical address to a physical address of the memory device 220 by using the address information AI. The memory control core 122 may provide the second request REQ2 suitable for the memory device 220 to the memory interface block 126.

The memory interface block 126 may register the second request REQ2 from the memory control core 122 at a queue. The memory interface block 126 may transmit a request that is first registered at the queue to the memory device 220 as a third request REQ3.

When the first request REQ1 is a write request, the host interface block 125 may write data received from the host 100 to the internal memory 124. When the third request REQ3 is a write request, the memory interface block 126 may transmit data stored in the internal memory 124 to the memory device 220.

When data is completely written, the memory device 220 may transmit a third response RESP3 to the memory interface block 126. In response to the third response RESP3, the memory interface block 126 may provide the memory control core 122 with a second response RESP2 indicating that the data is completely written.

After the data is stored in the internal memory 124 or after the second response RESP2 is received, the memory control core 122 may transmit a first response RESP1 indicating that the request is completed to the host 100 through the host interface block 125.

When the first request REQ1 is a read request, the read request may be transmitted to the memory device 220 through the second request REQ2 and the third request REQ3. The memory interface block 126 may store data received from the memory device 220 in the internal memory 124. When data is completely transmitted, the memory device 220 may transmit the third response RESP3 to the memory interface block 126.

As the third response RESP3 is received, the memory interface block 126 may provide the memory control core 122 with the second response RESP2 indicating that the data is completely stored. As the second response RESP2 is received, the memory control core 122 may transmit the first response RESP1 to the host 100 through the host interface block 125.

The host interface block 125 may transmit data stored in the internal memory 124 to the host 100. In an exemplary embodiment, in the case in which data corresponding to the first request REQ1 is stored in the internal memory 124, the transmission of the second request REQ2 and the third request REQ3 may be omitted.

Figure 5:
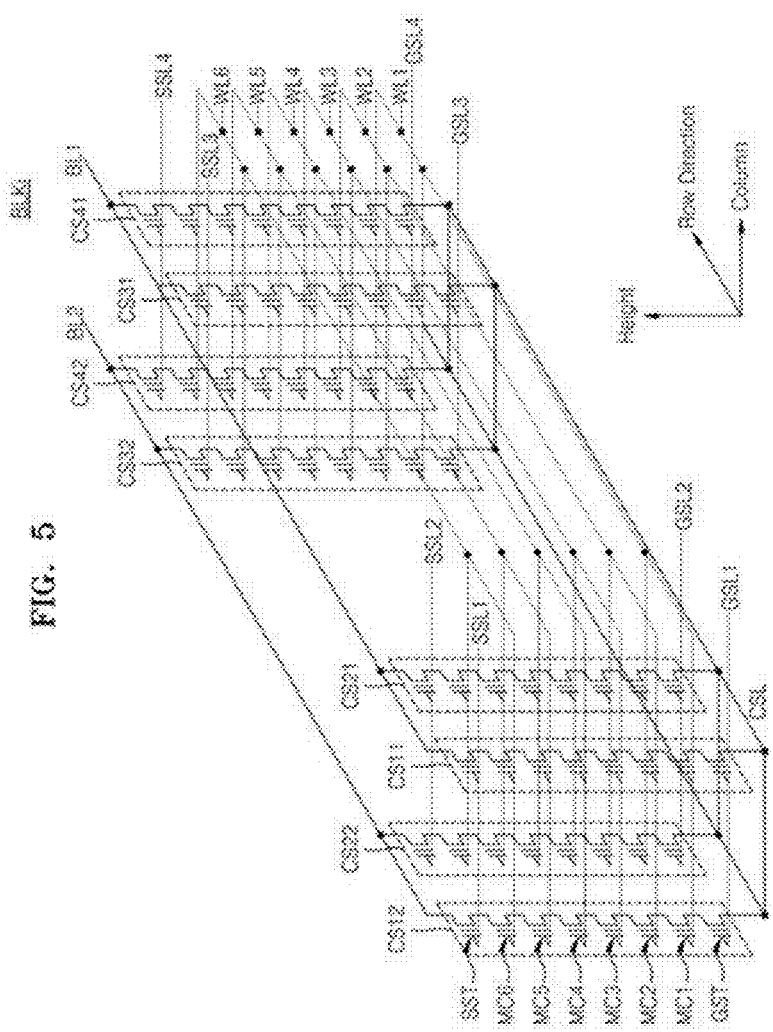
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Figure 6:
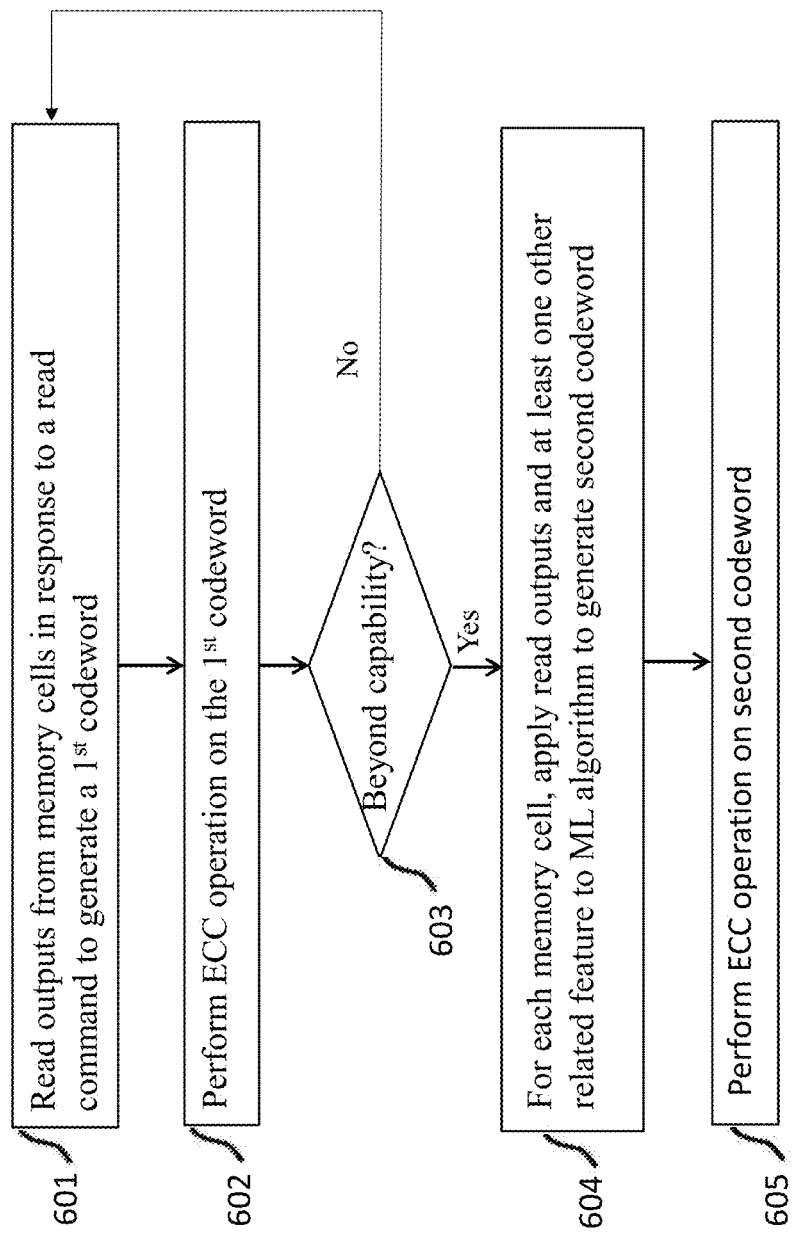
FIG. 6 is a method of performing an error correction operation according to an exemplary embodiment of the inventive concept.

FIG. 6 illustrates a method of correcting data according to an exemplary embodiment of the inventive concept.

The method of FIG. 6 includes reading outputs (e.g., reading cell voltages) from each of a plurality of memory cells of the memory device in response to a read command, and converting the read outputs into a first codeword (step 601). For example, the memory control core 122 of FIG. 3 may read voltages from memory cells of the memory device 220 indicated by address information and a read command received from the Host 100 through the Host Interface Block 125. The first codeword may include errors due to noise as an example.

The method of FIG. 6 further includes performing an ECC operation on the first codeword (step S602). For example, an ECC circuit of the memory control core 122 may be used to perform the ECC operation or the memory control core 122 may perform the ECC operation using software. Depending on the ECC operation performed, the memory control core 122 is capable of correcting a different number of bit errors. For example, if the ECC operation is capable of correcting 3 bit errors, then the ECC operation has an error correction capability of 3. For example, if the number of errors is not beyond the capability of the ECC operation, then the error correction by the ECC operation was successful and the method resumes to step S601 so it can operate on the next read command. If the number of bit errors exceeds the capability of the ECC operation, then the method resumes to step 604.

The method of FIG. 6 further includes, for each selected memory cell (e.g., the read memory cells), applying the corresponding read outputs (e.g., a value of the read voltage as a feature) and at least one other related feature to a machine learning algorithm (e.g., neural network) to generate a second codeword (step 604). In an alternate embodiment, the first codeword and the related features are applied to the machine learning algorithm to generate the second codeword.

In an exemplary embodiment, the machine learning algorithm outputs log probabilities for a plurality of threshold voltage levels and the second codeword is generated from these log probabilities. For example, if each memory cell is capable of storing 4 bits of data (e.g., 0000, 0001, ..., 1110, or 1111), then there would be 16 different threshold (TH) voltage levels to represent these 16 different states such as an erase state and 15 other program states. For example, when a cell voltage of a memory cell being read is less than a first one of these threshold voltage levels, the memory cell would be considered to be in an erase state, and when the cell voltage is between the first threshold voltage level and the second threshold voltage level, the memory cell would be considered to be in a first program state (e.g., 0001). For example, the neural network could output a log probability for each of the voltage levels. Ideally, the highest two log probabilities output by the neural network are log probabilities of two voltage thresholds that are adjacent to one another. In an exemplary embodiment of the inventive concept, the neural network was previously trained on features associated with a plurality of memory cells such a cell voltage of each memory cell. In an exemplary embodiment, the neural network was previously trained on a plurality of features such as a cell voltage of a selected memory cell connected to a certain wordline and a certain bitline, and at least one or more same-pillar neighbour voltages from neighbouring memory cells connected to the same bitline, one or more same wordline neighbour voltages from neighbouring memory cells connected to the same wordline, hard decision (HD) threshold voltages of the wordline, and a wordline index of the wordline. For example, the same-pillar neighbour voltages of a memory cell connected to a certain bitline includes the cell voltages of other memory cells that are connected to the same bitline. For example, if the read memory cell is connected to a fifth wordline and a third bitline, then a same-pillar neighbour voltage of a neighbour memory cell connected to the third bitline and the fourth wordline and a same-pillar neighbour voltage of a neighbour memory cell connected to the third bitline and the sixth wordline could be applied as same-pillar neighbour voltage features to the neural network. For example, a same wordline neighbour voltage of a neighbour memory cell connected to the fifth wordline and the second bitline and a same wordline neighbour voltage of a memory cell connected to the fifth wordline and the fourth bitline could be applied as same wordline neighbour voltage features to the neural network. Each wordline of a memory device (e.g., 221) may have different HD threshold voltage levels. The memory controller 210, the internal memory 124, or the memory device 220 may store all of these HD threshold voltage levels. The wordline index of a wordline is merely a number associated with the order the wordline appears within a group of wordlines of the memory device 220. For example, the first wordline would have a wordline index of 1, the twentieth wordline would have a wordline index of 20, etc.

Figure 7:
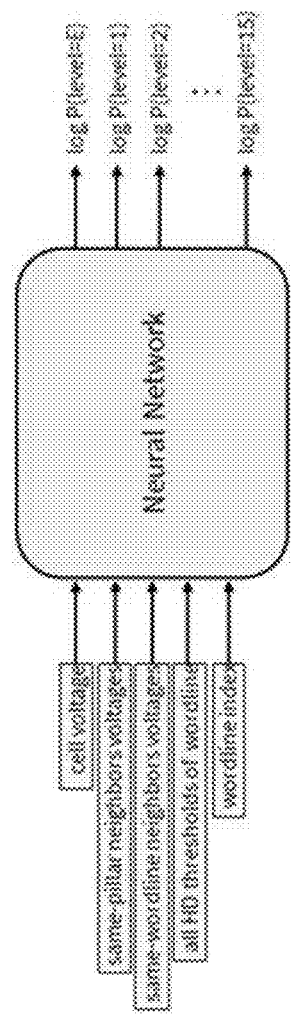
FIG. 7 is a diagram of inputs and outputs of a neural network used during the error correction operation according to an exemplary embodiment of the inventive concept.

FIG. 7 shows an example of the neural network, and the features that may be applied to the neural network as input, and the outputs of the neural network. However, the inventive concept is not limited to this specific neural network, and may be implemented by a neural network having various other configurations such as a convolutional neural network. Further, the neural network could also be replaced by various other machine learning architectures or algorithms.

Figure 8:
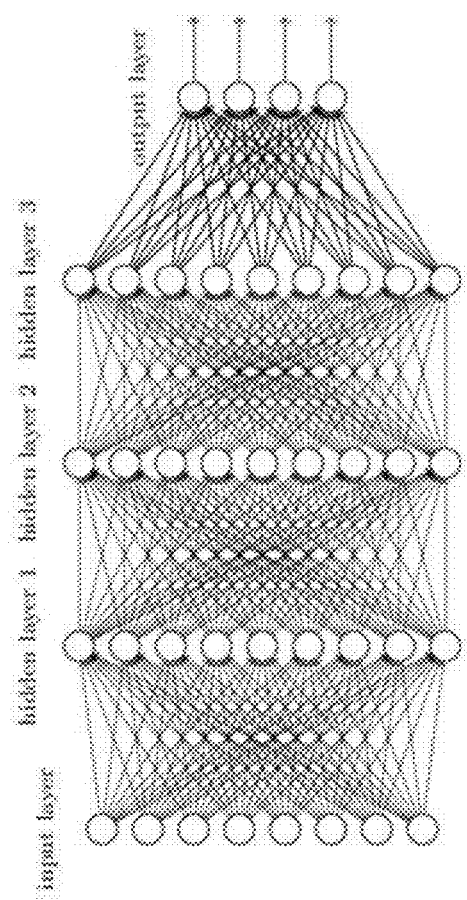
FIG. 8 is a diagram illustrating an exemplary structure of the neural network.

FIG. 8 illustrates one way to implement the neural network as an example. In this example, there are 2 hidden layers, an input layer, and an output layer. For example, if the neural network was trained on all 5 features of FIG. 7, then the input layer would include five nodes, where each one receives a different one of the five features. For example, when a memory cell is capable of representing 16 different states (e.g., an erase state and 15 program states), the output layer would include 16 nodes, where each node outputs a log probability associated with the 16 different voltage thresholds.

Figure 9:
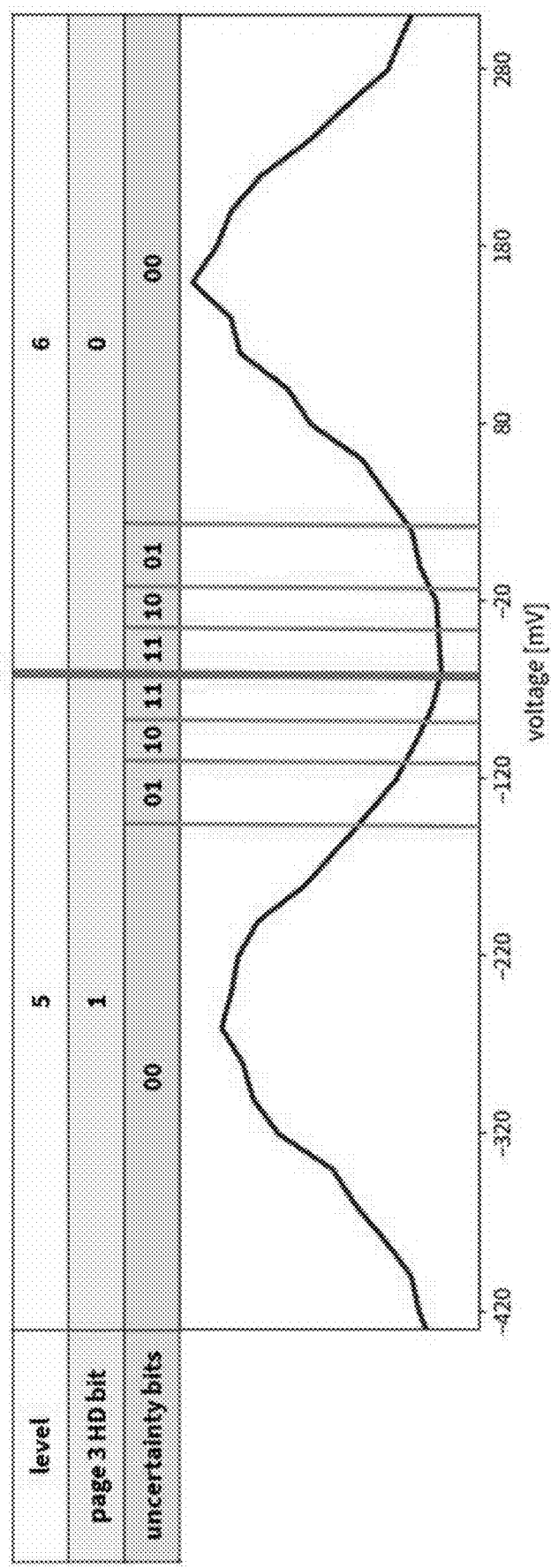
FIG. 9 is a diagram illustrating exemplary hard decision (HD) thresholds drawn against a voltage histogram.

The second codeword could be generated from read voltages and the log probabilities (step 605). For example, the log probabilities may be converted into uncertainty bits or soft-decision bits. In an exemplary embodiment, an ECC decoder (e.g., an ECC circuit or a processor executing an ECC algorithm) of the memory control core 122 receives 3 soft-decision (SD) bits (values) for each bit of read data it is attempting to correct. The ECC decoder computes a log likelihood ratio (LLR) for each codeword bit. For example, one of the 3 bits represents the HD assignment and the other two bits represent the uncertainty or reliability. The HD assignment is obtained by performing threshold operations. FIG. 9 is an example of a HD threshold between levels 5 and 6 drawn on top of a voltage histogram (e.g., 800 P/E cycles, 6 months retention). The machine learning core 123 may be referred to an equalizer or an equalizer circuit. The output of the neural network processed by the equalizer is in a form required by the ECC decoder. So, if the ECC decoder expects to receive 3 bits per codeword, then the output of the neural network is converted into this form before it is output to the ECC decoder.

If the neural network was trained on same-pillar neighbour voltages and same word-lines neighbour voltages along with the cell voltage, then it would be necessary to read the voltages so they can be applied to the neural network along with the cell voltage. For example, if the cell voltage corresponds to a selected memory cell connected to a third wordline and a third bitline, then the equalizer would read cell voltages of memory cells connected to the third wordline and the second and fourth bitlines and cell voltages of memory cells connected to the third bitline and the second and fourth wordlines, and apply these as features along with the cell voltage to the neural network. In an exemplary embodiment, the memory control core 122 or the equalizer calculates a new LLR value from the values output by the neural network. In an exemplary embodiment, the memory control core 122 or the equalizer calculates the new LLR value from the two largest values output by the neural network. For example, if the cell voltage of a selected memory cell is between levels 5 and 6, and one is interested in the LLR for page 3, then it will always be true that only the log probability of level 5 and the log probability of level 6 are important and the other values are 0. The LLR may be computed from log P (level=6)–log P (level=5).

The memory control core 122 may attempt to read data from a memory cell connected to a given wordline. The memory control core 122 may generate an LLR value from the read data. For example, assume the LLR value is 2.3. However, the ECC decoder operates on a 3-bit value.

FIG. 10 is used to convert the LLR of 2.3 to 3SD bits of 010, but then using the ECC decoder on the 3SD bits, it is determined that there is an error in the bit that cannot be corrected. When this occurs, the features of FIG. 11 including the cell voltage are applied to the neural network to get a log probability of −0.42 for level 5 and a log probability of −1.08 for level 6.

For example, as shown in FIG. 11, the features could include a −20 mv cell voltage of a selected memory cell connected to a 100th wordline and a third bitline, a 1280 mv pillar neighbour up voltage of the memory cell connected to the $99^{th}$ wordline and the third bitline, a 2140 mv pillar neighbour down voltage of the memory cell connected to a 101th wordline and the third bitline, the voltages (e.g., 2320, −620, 1280, 940, −80, −1740) of memory cells connected to the $100^{th}$ wordline that are adjacent the selected memory connected to the third bitline, the 16 HD threshold voltages of the $100^{th}$ wordline, and the 100 wordline index of the $100^{th}$ wordline. Assuming the output of the neural network from most of the output nodes is very small and only the output nodes associated with levels 6 and 5 have outputs of −1.08 volts and −0.42 voltages respectively, then the LLR is calculated by subtracting −1.08 −−0.42=−0.66. Then by referencing the LLR table of FIG. 10, it can be determined that SD bits of 111 is closest to an LLR of −0.66, which corresponds to a HD value of 1 and uncertainty bits of 11. Thus, the equalizer has updated the initial 3SD value of 010 to 111. By changing the 3SD reads, and feeding the new 3SD bits (e.g., 111) to the ECC decoder, no changes are required to the ECC decoder interface.

The method of FIG. 6 further includes performing an ECC operation on the second codeword (step 606). For example, the ECC decoder again attempts to error correct the read data, but this time uses the second codeword generated in step 604. In an exemplary embodiment, the equalizer is applied to only cells whose 3SD reading give "weak" results (e.g., have high uncertainty). Referring to the histogram of FIG. 9, the equalizer is only applied to cells whose two uncertainty bits are either 01, 10, or 11. For each weak cell, the neural network calculates an improved LLR. Once the improved LLR has been calculated, its corresponding 3SD value (e.g., an error correction code) can be calculated by reference to an LLR lookup table like that depicted in FIG. 10. For the "strong" cells, the original 3SD values are kept. The combined effect of improving many LLRs will allow an ECC decoder to successfully process codewords that were previously not decodable.

Figure 12:
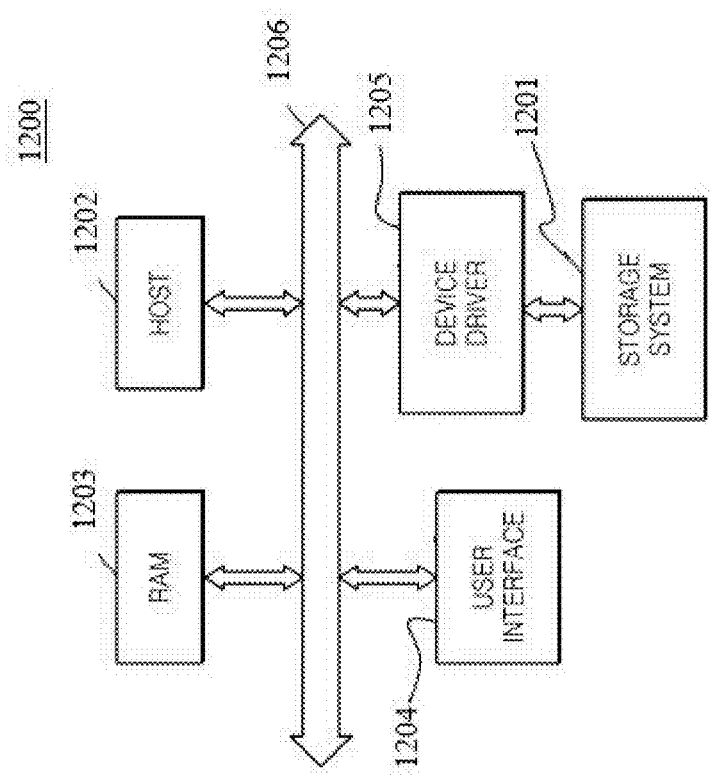
FIG. 12 is a block diagram of a computing system including a non-volatile memory system, according to an exemplary embodiment of the inventive concept.

FIG. 12 is a block diagram of a computing system 1200 including a non-volatile memory system, according to an exemplary embodiment of the inventive concept.

The non-volatile memory system in FIG. 12 may be the memory system 200 illustrated in FIG. 1. In the computing system 1200, which may be, for example, a mobile device or a desktop computer, the non-volatile memory system may be mounted as a non-volatile storage system 1201, however exemplary embodiments are not limited thereto.

The computing system 1200 may include, for example, a host 1202 including a CPU, a RAM 1203, a user interface 1204, and a device driver 1205. The host 1202 may be the host 100 illustrated in FIG. 1, and the device driver 1205 may be the memory device driver 111 illustrated in FIG. 1. These elements are electrically connected to a bus 1206. The non-volatile storage system 1201 may be connected to the device driver 1205. The host 1202 may control the entire computing system 1200 and perform an operation corresponding to a user command input through the user interface 1204. The RAM 1203 may function as a data memory of the host 1202. The host 1202 may write user data to or read user data from the non-volatile storage system 1201 through the device driver 1205. In FIG. 12, the device driver 1205 that controls the operation and management of the non-volatile storage system 1201 is illustrated as being disposed outside the host 1202, however exemplary embodiments are not limited thereto. For example, in an exemplary embodiment, the device driver 1205 may be disposed inside the host 1202.

In exemplary embodiments of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

Exemplary embodiments of the present invention may be embodied directly in hardware, in a software module executed by a processor, or in a combination of the two. A software module may be tangibly embodied on a non-transitory program storage device such as, for example, in RAM memory, flash memory, ROM memory, EPROM memory, EEPROM memory, registers, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC).

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A memory system, comprising:
a memory device comprising a plurality of memory cells, a plurality of wordlines, and a plurality of bitlines; and
a memory controller comprising a processor,
wherein the memory controller is configured to read outputs from the memory cells in response to a read command from a host to generate a first codeword,
wherein the memory controller is further configured to perform a first error correcting code (ECC) operation on the first codeword,
wherein the processor is configured to apply, for each selected memory cell among the memory cells, a corresponding one of the read outputs and a neighbour voltage of a neighbour memory cell as input features to a machine learning algorithm to generate a second codeword, and the memory controller is further configured to perform a second ECC operation using the second codeword, when the first ECC operation fails,
where the neighbour memory cell is connected to a same one of the wordlines as the selected memory cell.

2. The memory system of claim 1, wherein each memory cell stores N bits of data, the machine learning algorithm outputs a log probability for each of $2^N$ threshold voltage levels, and the processor generates the second codeword from the log probabilities, where N is a positive integer.

3. The memory system of claim 2, wherein the processor determines a log likelihood ratio (LLR) from the log probabilities associated with each of the memory cells, and generates the second codeword from the LLRs.

4. The memory system of claim 1, wherein the input features further comprise a pillar voltage of a neighbour memory cell connected to a same one of the bitlines as the selected memory cell.

5. The memory system of claim 1, wherein the input features further comprise hard decision (HD) threshold voltages associated with the one wordline.

6. A computer-implemented method for controlling a memory system comprising a memory device and a memory controller including a processor, the method comprising:
  sensing, by the memory controller, outputs from the memory cells in response to a read command from a host;
  performing, by the memory controller, a first correcting code (ECC) operation on a first codeword determined from the sensed outputs; and
  when the first ECC operation fails, the method further comprising:
    applying, by the processor, for each selected memory cell among the memory cells, a corresponding one of the sensed outputs and a neighbour voltage of a neighbour memory cell as input features to a machine learning algorithm to generate a second codeword; and
    performing, by the memory controller, a second ECC operation using the second codeword,
    wherein the neighbour memory cell is connected to a same one of the wordlines as the selected memory cell.

7. The method of claim 6, wherein each memory cell stores N bits of data, the machine learning algorithm outputs a log probability for each of $2^N$ threshold voltage levels, and the processor generates the second codeword from the log probabilities, where N is a positive integer.

8. The method of 7, wherein the processor determines a log likelihood ratio (LLR) from the log probabilities associated with each of the memory cells, and generates the second codeword from the LLRs.

9. The method of claim 6, wherein the input features further comprise a pillar voltage of a neighbour memory cell connected to a same one of the bitlines as the selected memory cell.

10. The method of claim 6, wherein the input features further comprise hard decision (HD) threshold voltages associated with the one wordline.

11. A memory system, comprising:
  a memory device comprising a plurality of memory cells, a plurality of wordlines, and a plurality of bitlines; and
  a memory controller comprising a processor,
  wherein the memory controller is configured to read outputs from the memory cells in response to read command from a host and convert the read voltages into a first codeword,
  wherein the memory controller is further configured to perform a first error correcting code (ECC) operation on the first codeword,
  wherein the processor is configured to apply, for each selected memory cell among the memory cells, a corresponding one of the read outputs and a pillar voltage of a neighbour memory cell as input features to a machine learning algorithm to generate a second codeword, and the memory controller is configured to perform a second ECC operation using the second codeword, when the first ECC operation fails, where the neighbour memory cell is connected to a same one of the bitlines as the selected memory cell.

12. The memory system of claim 11, wherein each memory cell stores N bits of data, the machine learning algorithm outputs a log probability for each of $2^N$ threshold voltage levels, and the processor generates the second codeword from the log probabilities, where N is a positive integer.

13. The memory system of claim 12, wherein the processor determines a log likelihood ratio (LLR) from the log probabilities associated with each of the memory cells, and generates the second codeword from the LLRs.

14. The memory system of claim 11, wherein the input features further comprise a neighbour voltage of a neighbour memory cell connected to a same wordline as the selected memory cell.

15. The memory system of claim 14, wherein the input features further comprise hard decision (HD) threshold voltages associated with the same wordline.

16. A computer-implemented method for controlling a memory system comprising a memory device and a memory controller including a processor, the method comprising:
  sensing, by the memory controller, outputs from the memory cells in response to read command from a host;
  performing, by the memory controller, a first correcting code (ECC) operation on a first codeword generated from the sensed outputs; and
  when the first ECC operation fails, the method further comprising:
    applying, by the processor, for each selected memory cell among the memory cells, a corresponding one of the sensed outputs and a pillar voltage of a neighbour memory cell as input features to a machine learning algorithm to generate a second codeword; and
    performing, by the memory controller, a second ECC operation on the second codeword,
    where the neighbour memory cell is connected to a same one of the bitlines as the selected memory cell.

17. The method of claim 16, wherein each memory cell stores N bits of data, the machine learning algorithm outputs a log probability for each of $2^N$ threshold voltage levels, and the processor generates the second codeword from the log probabilities, where N is a positive integer.

18. The method of claim 17, wherein the processor determines a log likelihood ratio (LLR) from the log probabilities associated with each of the memory cells, and generates the second codeword from the LLRs.

19. The method of claim 16, wherein the input features further comprise a neighbour voltage of a neighbour memory cell connected to a same one of the wordlines as the selected memory cell.

20. The method of claim 19, wherein the input features further comprise hard decision (HD) threshold voltages associated with the one wordline.

* * * * *